(12) United States Patent
Hamamoto et al.

(10) Patent No.: US 8,614,282 B2
(45) Date of Patent: Dec. 24, 2013

(54) LOW GAS PERMEABLE SILICONE RESIN COMPOSITION AND OPTOELECTRONIC DEVICE

(75) Inventors: Yoshihira Hamamoto, Annaka (JP); Tsutomu Kashiwagi, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 146 days.

(21) Appl. No.: 13/223,937

(22) Filed: Sep. 1, 2011

(65) Prior Publication Data

US 2012/0056236 A1    Mar. 8, 2012

(30) Foreign Application Priority Data

Sep. 2, 2010   (JP) ................................. 2010-196667

(51) Int. Cl.
*C08L 83/04*     (2006.01)

(52) U.S. Cl.
USPC ............... 525/477; 525/478; 528/15; 528/31; 528/32; 528/43; 428/447

(58) Field of Classification Search
None
See application file for complete search history.

(56) References Cited

U.S. PATENT DOCUMENTS

| 7,649,059 | B2 * | 1/2010 | Yoshitake et al. | ............. 525/478 |
| 8,071,697 | B2 * | 12/2011 | Frisch et al. | .................. 525/478 |
| 8,258,502 | B2 * | 9/2012 | Yoshitake et al. | ............. 257/40 |
| 2010/0276721 | A1 | 11/2010 | Yoshitake et al. | |
| 2011/0160410 | A1 | 6/2011 | Sagawa et al. | |

FOREIGN PATENT DOCUMENTS

| JP | 2009-527622 A | 7/2009 |
| JP | 2010-1335 A | 1/2010 |
| WO | WO 2007/100445 A2 | 9/2007 |
| WO | WO 2009/154260 A1 | 12/2009 |

* cited by examiner

*Primary Examiner* — Marc Zimmer
(74) *Attorney, Agent, or Firm* — Birch, Stewart, Kolasch & Birch, LLP

(57) ABSTRACT

A silicone resin composition comprising (A) an organopolysiloxane containing silicon-bonded aryl and alkenyl groups in a molecule, (B) an organohydrogenpolysiloxane, and (C) an addition reaction catalyst is low gas permeable. An optoelectronic device encapsulated therewith is highly reliable.

15 Claims, No Drawings

LOW GAS PERMEABLE SILICONE RESIN COMPOSITION AND OPTOELECTRONIC DEVICE

CROSS-REFERENCE TO RELATED APPLICATION

This non-provisional application claims priority under 35 U.S.C. §119(a) on Patent Application No. 2010-196667 filed in Japan on Sep. 2, 2010, the entire contents of which are hereby incorporated by reference.

TECHNICAL FIELD

This invention relates to low gas permeable silicone resin compositions useful as encapsulants for optoelectronic members, and optoelectronic devices encapsulated with silicone products.

BACKGROUND ART

Recently, high-intensity LED products featuring high luminance emission and entailing substantial heat release are commercially marketed. Besides use as backlight units in liquid crystal displays and mobile phones, LED products now find widespread use as general illuminations and the like. WO 2009/154260 discloses an encapsulating material having heat resistance, photostability and weather resistance in which an epoxy-containing silicone is added to a phenyl-containing silicone resin for improving adherence. WO 2007/100445 discloses that a silicone resin composition comprising a phenyl-containing resin and a linear phenyl-containing hydrogen-oligoorganosiloxane is useful in prolonging the lifetime of LED.

Commonly used as LED packages are leadframes in the form of copper plates having silver electroplated thereon. It is known that if silicone resin-encapsulated LED is held under sulfur releasing service conditions, a blackening problem that the silver surface discolors to black due to formation of silver sulfide occurs because the silicone resin is gas permeable. Blackening of leadframes causes a lowering of LED luminance. The encapsulant resins are thus required to be low gas permeable. Although the aforementioned silicone resins have light resistance, thermal discoloration resistance, and impact resistance, a discoloration phenomenon still occurs in a sulfide test on a phenyl-containing silicone resin which is improved in adherence by adding epoxy groups or the like, or a reliable resin resulting from a combination of a phenyl-containing resin with a linear phenyl-containing hydrogen oligoorganosiloxane. This is true even when the phenyl-containing silicone resin which is considered low gas permeable among silicone resins is used.

CITATION LIST

Patent Document 1: WO 2009/154260 (JP-A 2010-001335)
Patent Document 2: WO 2007/100445 (JP-A 2009-527622)

SUMMARY OF INVENTION

An object of the invention is to provide a silicone resin composition useful for the encapsulation of optoelectronic members which exhibits a lower gas permeability than conventional phenyl-containing silicone resin compositions, and a reliable optoelectronic device encapsulated with the composition.

The inventors have found that a cured product of an addition reaction cure silicone resin composition comprising an organopolysiloxane of three-dimensional network structure having an aryl group on a terminal silicon atom along with an alkenyl group assumes a remarkably densified polymer structure because of the presence of an aryl group adjacent the silethylene bond on addition reaction terminus, as compared with ordinary phenyl silicone resins terminated with $(Me_2ViSiO_{1/2})$ unit, and exhibits a low value of gas permeability. The relevant silicone resin composition can prevent formation of cracks at the edge of LED chip or the root of leadframe in the LED package where substantial stresses are thermally and optically induced, without detracting from the characteristics of conventional silicone resin compositions. The cured product of the silicone resin composition remains fully reliable and is effective in inhibiting discoloration. When an optoelectronic member (e.g., high-intensity LED) is encapsulated with the cured product of the silicone resin composition, the resulting optoelectronic device is fully durable in terms of discoloration resistance and impact resistance.

In one aspect, the invention provides a low gas permeable silicone resin composition comprising (A) 20 to 95 parts by weight of an organopolysiloxane containing at least two alkenyl groups in a molecule, having the average compositional formula (1):

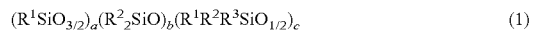

wherein $R^1$ is each independently $C_6$-$C_{14}$ aryl, $R^2$ which may be the same as or different from $R^1$ is each independently a substituted or unsubstituted, monovalent hydrocarbon group, $R^3$ is $C_2$-$C_8$ alkenyl, a is a positive number of 0.3 to 0.9, b is a positive number of 0 to 0.5, c is a positive number of 0.05 to 0.7, and a+b+c=1.0, (B) 0.01 to 40 parts by weight of an organohydrogenpolysiloxane containing at least two silicon-bonded hydrogen atoms in a molecule, having the average compositional formula (2):

wherein $R^1$ and $R^2$ are as defined above, d is a positive number of 0.6 to 1.5, e is a positive number of 0 to 0.5, f is a positive number of 0.4 to 1.0, and d+e+f=1.0 to 2.5, and (C) a catalytic amount of an addition reaction catalyst.

Preferably, component (B) is present in such an amount as to provide 0.4 to 4.0 moles of SiH groups per mole of alkenyl groups in component (A).

Preferably, component (B) comprises 50 to 100% by weight of an organohydrogenpolysiloxane having the general formula (3):

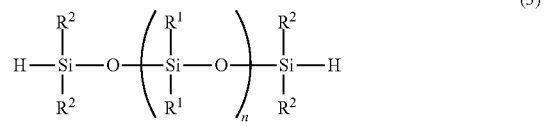

wherein $R^1$ is each independently $C_6$-$C_{14}$ aryl, $R^2$ which may be the same as or different from $R^1$ is each independently a substituted or unsubstituted, monovalent hydrocarbon group, and n is an integer of at least 1.

The silicone resin composition may further comprise (A') an organopolysiloxane having the general formula (4):

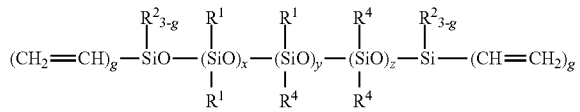

(4)

wherein $R^1$ is each independently $C_6$-$C_{14}$ aryl, $R^2$ which may be the same as or different from $R^1$ is each independently a substituted or unsubstituted, monovalent hydrocarbon group, $R^4$ which may be the same as or different from $R^1$ is each independently a substituted or unsubstituted, monovalent hydrocarbon group, g is an integer of 1, 2 or 3, x, y and z each are 0 or a positive integer, satisfying $1 \leq x+y+z \leq 1{,}000$, and at least one of x and y is at least 1. Component (A') is present in an amount of 0.01 to 50 parts by weight per 100 parts by weight of components (A) and (B) combined.

In a preferred embodiment, the silicone resin composition may further comprise (D) a tackifier, (E) a condensation catalyst, and/or (F) an inorganic filler.

Typically, the cured composition of 1 mm thick has a water vapor permeability of less than or equal to 15 g/m²/day.

The silicone resin composition is suited for use in encapsulating optoelectronic members.

In another aspect, the invention provides an optoelectronic device comprising an optoelectronic member encapsulated with the silicone resin composition defined above in the cured state:

ADVANTAGEOUS EFFECTS OF INVENTION

The silicone resin composition exhibits a fully low gas permeability because the aryl group at the terminus in component (A) provides a steric hindrance against gas transmission.

DESCRIPTION OF EMBODIMENTS

As used herein, the terminology "($C_x$-$C_y$)", as applied to a particular unit, such as, for example, a chemical compound or a chemical substituent group, means having a carbon atom content of from "x" carbon atoms to "y" carbon atoms per such unit.

The term "viscosity" is as measured at 25° C. by a rotational viscometer. The abbreviation Mw is a weight average molecular weight as measured by gel permeation chromatography (GPC) versus polystyrene standards.

The components of the silicone resin composition are described in detail.

A) Alkenyl-Containing Organopolysiloxane

Component (A) is an organopolysiloxane (or silicone resin) containing at least two alkenyl groups in a molecule, having the average compositional formula (1).

$$(R^1SiO_{3/2})_a(R^2_2SiO)_b(R^1R^2R^3SiO_{1/2})_c \quad (1)$$

Herein $R^1$ is each independently $C_6$-$C_{14}$ aryl, $R^2$ which may be the same as or different from $R^1$ is each independently a substituted or unsubstituted, monovalent hydrocarbon group, $R^3$ is $C_2$-$C_8$ alkenyl, a is a positive number of 0.3 to 0.9, b is a positive number of 0 to 0.5, c is a positive number of 0.05 to 0.7, and a+b+c=1.0.

In formula (1), $R^1$ is $C_6$-$C_{14}$ aryl. Suitable aryl groups include phenyl, tolyl, xylyl, and naphthyl, with phenyl being most desirable.

$R^2$ may be the same as or different from $R^1$ and is a substituted or unsubstituted, monovalent hydrocarbon group, preferably an aliphatic unsaturation-free monovalent hydrocarbon group of 1 to 10 carbon atoms, more preferably 1 to 6 carbon atoms. Suitable examples include alkyl groups such as methyl, ethyl, propyl, isopropyl, butyl, isobutyl, tert-butyl, pentyl, neopentyl, hexyl, octyl, nonyl, and decyl; cycloalkyl groups such as cyclopentyl and cyclohexyl; aryl groups such as phenyl, tolyl, xylyl, and naphthyl, like $R^1$; aralkyl groups such as benzyl, phenylethyl and phenylpropyl; and substituted forms of the foregoing in which some or all hydrogen atoms are replaced by halogen atoms (e.g., fluorine, bromine and chlorine), cyano groups or the like, for example, halo-substituted alkyl groups such as chloromethyl, chloropropyl, bromoethyl, and trifluoropropyl and cyano-substituted alkyl groups such as cyanoethyl.

$R^3$ is an alkenyl group of 2 to 8 carbon atoms, preferably 2 to 6 carbon atoms. Suitable alkenyl groups include vinyl, allyl, propenyl, isopropenyl, butenyl, hexenyl, cyclohexenyl, and octenyl, with vinyl or allyl being desirable. It is noted that the organopolysiloxane of formula (1) contains at least two alkenyl groups per molecule. The preferred organopolysiloxane has an alkenyl content of 0.001 to 0.2 mol/100 g, more preferably 0.005 to 0.1 mol/100 g.

The subscript a is a positive number of 0.3 to 0.9, preferably 0.5 to 0.8, b is a positive number of 0 to 0.5, preferably 0 to 0.2, and c is a positive number of 0.05 to 0.7, preferably 0.05 to 0.4, with the proviso a+b+c=1.0.

In the composition, component (A') may be used along with component (A).

A') Alkenyl-Containing Linear Organopolysiloxane

Component (A') is an organopolysiloxane of linear structure having a backbone consisting of recurring diorganosiloxane units (($R'$)$_2SiO_{2/2}$ units) and capped with a triorganosiloxy group (($R'$)$_3SiO_{1/2}$ unit) at both ends of the molecular chain.

Herein R' is each independently a substituted or unsubstituted, monovalent hydrocarbon group, preferably of 1 to 10 carbon atoms, more preferably 1 to 3 carbon atoms. Suitable hydrocarbon groups include alkyl groups such as methyl, ethyl, propyl, isopropyl, butyl, isobutyl, tert-butyl, pentyl, neopentyl, and hexyl; cycloalkyl groups such as cyclohexyl; alkenyl groups such as vinyl, allyl, and propenyl; aryl groups such as phenyl, tolyl, and xylyl; aralkyl groups such as benzyl, phenylethyl, and phenylpropyl; and substituted forms of the foregoing in which some or all hydrogen atoms are replaced by halogen atoms (e.g., fluorine, bromine and chlorine), cyano groups or the like, such as chloromethyl, chloropropyl, bromoethyl, trifluoropropyl, and cyanoethyl.

Inter alia, an organopolysiloxane having the following general formula (4), specifically a linear organopolysiloxane containing at least one vinyl group on the silicon atom at each end of the molecular chain, and having a viscosity at 25° C. of 10 to 1,000,000 mPa-s, more preferably 1,000 to 50,000 mPa-s is preferred for ease of working and cure. This organopolysiloxane may contain a minor proportion of branched structure (trifunctional siloxane units) in the molecular chain.

(4)

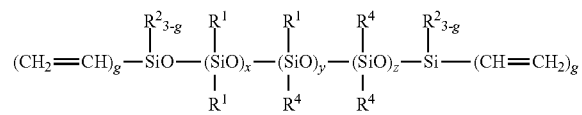

Herein $R^1$ and $R^2$ are as defined and exemplified above, $R^4$ which may be the same as or different from $R^1$ is each independently a substituted or unsubstituted, monovalent hydrocarbon group, g is an integer of 1, 2 or 3, x, y and z each are 0 or a positive integer, satisfying 1≤x+y+z≤1,000, and at least one of x and y is at least 1.

In formula (4), $R^4$ may be the same as or different from $R^1$ and is a substituted or unsubstituted, monovalent hydrocarbon group, examples of which are as illustrated for $R^2$. The subscripts x, y and z each are 0 or a positive integer, satisfying 1≤x+y+z≤1,000, preferably 5≤x+y+z≤500, more preferably 30≤x+y+z≤500, with the proviso 0.5<(x+y)/(x+y+z)≤1.0.

Examples of the organopolysiloxane having formula (4) are shown below.

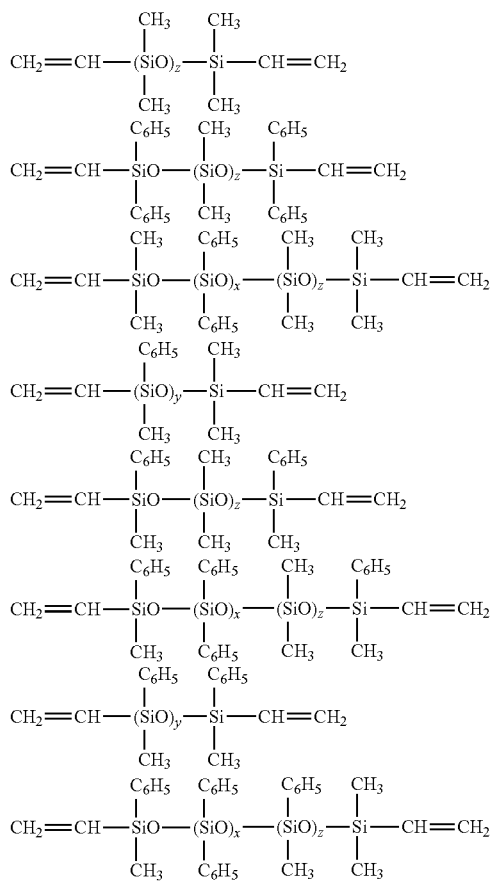

Herein x, y and z are as defined above.

When used, an amount of component (A') is 0.01 to 50 parts by weight, more preferably 10 to 30 parts by weight per 100 parts by weight of components (A) and (B). If component (A') is used in excess of the range, the resin surface may become tacky and gas permeability may become high.

While component (A) is an organopolysiloxane of resin structure (i.e., three-dimensional network structure), component (A') is a linear organopolysiloxane. These organopolysiloxanes may be derived from one or more organopolysiloxanes comprising $R^6SiO_{1.5}$ units, $R^5_kR^6_pSiO$ units, and $R^5_qR^6_rSiO_{0.5}$ units wherein $R^5$ is independently vinyl or allyl, $R^6$ is independently a substituted or unsubstituted monovalent hydrocarbon group free of aliphatic unsaturation, k, p, q and r are integers, k is 0 or 1, p is 1 or 2, k+p=2, q is 1, and r is 2. Examples of group $R^6$ are as exemplified above for $R^2$, with phenyl being preferred.

The organopolysiloxane of resin structure may preferably consist of $R^6SiO_{1.5}$ units, $R^5_kR^6_pSiO$ units, and $R^5_qR^6_rSiO_{0.5}$ units, which are referred to as a' units, b' units, and c' units, respectively, in a molar ratio (b'+c')/a'=0.01 to 2, more preferably 0.1 to 1.2, and c'/a'=0.05 to 2, more preferably 0.1 to 1.0. This organopolysiloxane should preferably have a Mw of 500 to 10,000, more preferably 1,000 to 4,000 as measured by GPC versus polystyrene.

The organopolysiloxane of resin structure may be readily synthesized by combining a', b' and c' unit-providing monomers so as to meet a molar ratio as defined above, and effecting cohydrolytic reaction in the presence of an acid, for example. Also, the linear organopolysiloxane may be similarly synthesized using b' and c' unit-providing monomers.

Examples of the a' unit-providing monomer which can be used herein include, but are not limited to, phenyltrichlorosilane, phenyltrimethoxysilane, phenyltriethoxysilane, cyclohexyltrichlorosilane, cyclohexyltrimethoxysilane, cyclohexyltriethoxysilane, cyclopentyltrichlorosilane, n-propyltrichlorosilane, methyltrichlorosilane, methyltrimethoxysilane, and methyltriethoxysilane.

Examples of the b' unit-providing monomer which can be used herein are shown below.

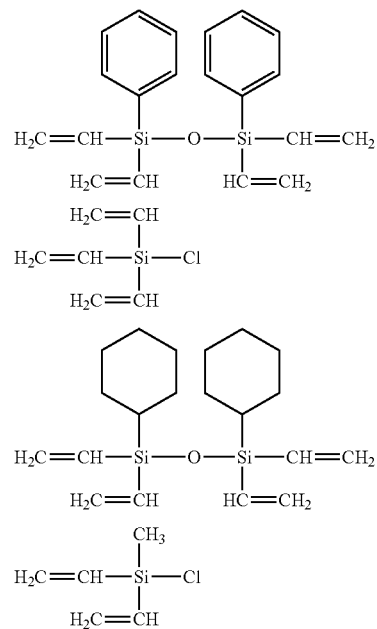

Examples of the c' unit-providing monomer which can be used herein are shown below.

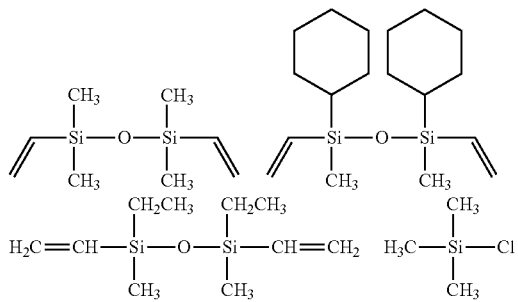

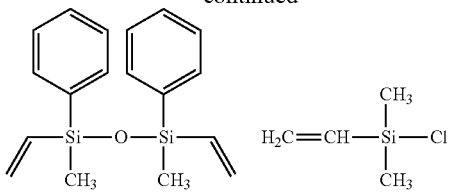

Examples of the organopolysiloxane having formula (1) are shown below wherein a, b and c are as defined above.

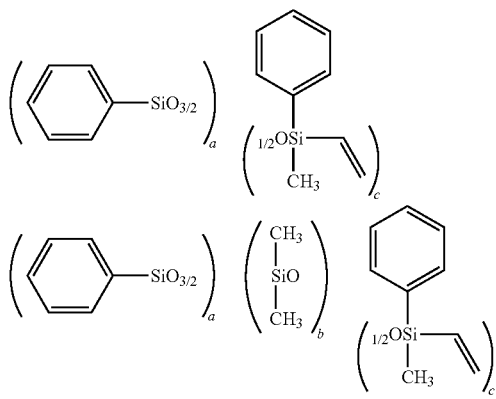

B) Organohydrogenpolysiloxane

Component (B) is an organohydrogenpolysiloxane which serves as a crosslinker in that addition reaction takes place between alkenyl groups in component (A) and silicon-bonded hydrogen atoms (i.e., SiH groups) in component (B), thereby to forming a cured product. It is an organohydrogenpolysiloxane containing at least two silicon-bonded hydrogen atoms in a molecule, having the average compositional formula (2):

$$R^1_d R^2_e H_f SiO_{(4-d-e-f)/2} \quad (2)$$

wherein $R^1$ and $R^2$ are as defined above, d is a positive number of 0.6 to 1.5, e is a positive number of 0 to 0.5, f is a positive number of 0.4 to 1.0, and d+e+f=1.0 to 2.5.

In formula (2), $R^1$ and $R^2$ are as defined and exemplified above in conjunction with formula (1), and preferably monovalent hydrocarbon groups of 1 to 7 carbon atoms, for example, $C_1$-$C_3$ lower alkyl groups such as methyl and aryl groups such as phenyl. It is preferred that phenyl be included in $R^1$ and $R^2$. The subscript d is a positive number of 0.6 to 1.5, preferably 0.6 to 1.4, e is a positive number of 0 to 0.5, preferably 0 to 0.4, f is a positive number of 0.4 to 1.0, preferably 0.4 to 0.8, and d+e+f=1.0 to 2.5, preferably 1.5 to 2.4. The position of SiH group in the molecule is not particularly limited, and SiH group may be positioned at the end or an intermediate of the molecular chain.

B1) Linear Organohydrogenpolysiloxane

In a preferred embodiment, a portion of the organohydrogenpolysiloxane as component (B) which accounts for at least 50% by weight, specifically 50 to 100% by weight, more specifically 60 to 90% by weight of the organohydrogenpolysiloxane is a linear organohydrogenpolysiloxane having two SiH groups at the end which may be partially branched. The linear organohydrogenpolysiloxane may have the following general formula (3):

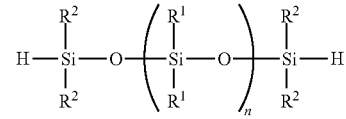

wherein $R^1$ and $R^2$ are as defined above, and n is an integer of at least 1, preferably 1 to 50, more preferably 1 to 10.

In formula (3), $R^1$ and $R^2$ are as defined and exemplified above in conjunction with formula (1).

B2) Other Organohydrogenpolysiloxane

There may be included an organohydrogenpolysiloxane other than component (B1). It may be an organohydrogenpolysiloxane containing at least three SiH groups, preferably 3 to 10 SiH groups, and more preferably 3 to 6 SiH groups in a molecule, which is preferably branched. The position of SiH group in the molecule is not particularly limited, and SiH group may be positioned at the end or an intermediate of the molecular chain. The other organohydrogenpolysiloxane is optional. It may be added in an amount of less than 50% by weight, specifically 0 to 30% by weight of the organohydrogenpolysiloxane as component (B) while it may be omitted in some cases.

Examples of the other organohydrogenpolysiloxane include tris(dimethylhydrogensiloxy)methylsilane, tris(dimethylhydrogensiloxy)phenylsilane, 1,1,3,3-tetramethyldisiloxane, 1,3,5,7-tetramethylcyclotetrasiloxane, trimethylsiloxy-endcapped methylhydrogenpolysiloxane, trimethylsiloxy-endcapped dimethylsiloxane/methylhydrogen-siloxane copolymers, dimethylhydrogensiloxy-endcapped dimethylsiloxane/methyl-hydrogensiloxane copolymers, trimethylsiloxy-endcapped methylhydrogensiloxane/diphenyl-siloxane copolymers, trimethylsiloxy-endcapped methylhydrogensiloxane/diphenyl-siloxane/dimethylsiloxane copolymers, copolymers of $(CH_3)_2HSiO_{1/2}$ and $SiO_{4/2}$ units, and copolymers of $(CH_3)_2HSiO_{4/2}$, and $(C_6H_5)SiO_{3/2}$ units. As used herein and throughout the disclosure, the term "endcapped" means that a compound is capped at both ends with the indicated group unless otherwise stated.

Exemplary organohydrogenpolysiloxanes as shown below are also useful.

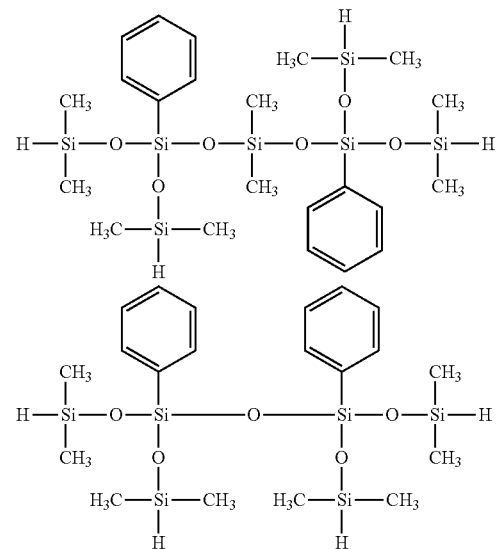

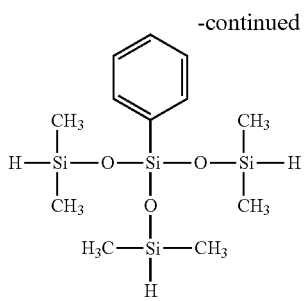

The molecular structure of the organohydrogenpolysiloxane may be a linear, cyclic, branched or three-dimensional network structure while the number of silicon atoms per molecule (or degree of polymerization) is preferably 3 to 100, more preferably 3 to 10.

The organohydrogenpolysiloxane may be prepared by any well-known methods, for example, by effecting hydrolytic condensation of chlorosilanes such as $R^7SiHCl_2$, $(R^7)_3SiCl$, $(R^7)_2SiCl_2$ or $(R^7)_2SiHCl$ wherein $R^7$ is a substituted or unsubstituted, monovalent hydrocarbon group free of aliphatic unsaturation, as exemplified above for $R^6$, or by further equilibrating the siloxane resulting from hydrolytic condensation in the presence of a strong acid catalyst.

In the organohydrogenpolysiloxane thus obtained, not only hydrogen is attached to the terminal silicon atom, but also a hydroxyl group and alkoxy group (if an alkoxysilane is used as reactant) may be left attached. Even such an organohydrogenpolysiloxane may be used herein although the amount of hydroxyl and alkoxy substituent groups is preferably 0.1 to 8 mol %, more preferably 1 to 7 mol %, based on the total of silicon-bonded hydrogen atoms, silicon bonded hydroxyl groups, and silicon-bonded alkoxy groups. If the amount of substituent groups exceeds the range, those siloxanes terminated with alkoxy or hydroxyl group are present in a large fraction. Apart from the function of adhesion promoter, such organohydrogenpolysiloxane may cause a drop of reliability in a reliability test, particularly under intense heat or light conditions or moist conditions, by severing siloxane bonds and thus allowing cracks to form within the encapsulant or delamination to occur at the encapsulant/silver interface in the package.

The organohydrogenpolysiloxane as component (B) should preferably have a hydrogen gas release of 70 to 200 ml/g.

The organohydrogenpolysiloxane (B) is added in an effective amount for components (A) and (A') to cure, and preferably in such an amount that 0.5 to 4.0 moles of SiH groups may be available per mole of alkenyl groups (typically vinyl) in components (A) and (A') combined. The amount of SiH group is more preferably 0.8 to 2.0 moles, and even more preferably 0.9 to 1.5 moles per mole of alkenyl groups in components (A) and (A') combined. With a less amount of SiH groups below the range, effective cure reaction may not run, failing to obtain a cured product. Beyond the range, more SiH groups may be left unreacted in the cured product, causing rubber physical properties to change with the lapse of time. Where an alkenyl-containing compound is used as the optional component (D) or tackifier to be described later, the amount of SiH groups in component (B) is generally 0.4 to 4.0 moles, preferably 0.5 to 4.0 moles, more preferably 0.8 to 2.0 moles, and even more preferably 0.9 to 1.5 moles per mole of alkenyl groups in components (A), (A') and (D) combined.

The amount of phenyl groups in components (A), (A') and (B) is preferably 20 to 50% by weight, more preferably 30 to 45% by weight based on the total weight of components (A), (A') and (B). A phenyl content of less than 20 wt % may lead to a higher gas permeability which allows for corrosion of the silver surface within the LED package, resulting in a lowering of luminance. A phenyl content of more than 50 wt % may lead to losses of heat resistance and light resistance. Where a phenyl-containing compound is used as the optional component (D) or tackifier to be described later, the amount of phenyl groups in components (A), (A'), (B) and (D) is preferably 20 to 50% by weight, more preferably 30 to 45% by weight based on the total weight of components (A), (A'), (B) and (D).

C) Addition Reaction Catalyst

Component (C) is an addition reaction catalyst which is added to promote addition reaction between alkenyl groups in component (A) and SiH groups in component (B). The catalyst may be selected from platinum, palladium, and rhodium base compounds, with platinum group metal base catalysts being preferred from the standpoint of cost or the like. Exemplary platinum group metal base catalysts include $H_2PtCl_6.mH_2O$, $K_2PtCl_6$, $KHPtCl_6.mH_2O$, $K_2PtCl_4$, $K_2PtCl_4.mH_2O$, and $PtO_2.mH_2O$ wherein m is a positive integer. Also useful are complexes of the platinum group metal base catalysts with hydrocarbons (e.g., olefins), alcohols, or vinyl-containing organopolysiloxanes. The catalysts may be used alone or in combination of two or more.

The addition reaction catalyst may be added in a catalytic amount, preferably in such an amount as to provide 0.0001 to 2 parts, more preferably 0.0001 to 0.05 part by weight of platinum group metal per 100 parts by weight of components (A) and (B).

D) Tackifier

In addition to the essential components (A) to (C), the silicone resin composition may further comprise (D) a tackifier. Suitable tackifiers include silane coupling agents such as vinyltrimethoxysilane, vinyltriethoxysilane, 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, 3-methacryloxypropylmethyldiethoxysilane, 3-methacryloxypropyltrimethoxysilane, 3-methacryloxypropylmethyldiethoxysilane, 3-methacryloxypropyltriethoxysilane, N-(2-aminoethyl)-3-aminopropylmethyldimethoxysilane, N-(2-aminoethyl)-3-aminopropyltrimethoxysilane, N-(2-aminoethyl)-3-aminopropyltriethoxysilane, 3-aminopropyltrimethoxysilane, 3-aminopropyltriethoxysilane, N-phenyl-3-aminopropyltrimethoxysilane, and 3-mercaptopropyltrimethoxysilane; and trimethoxysilane, tetramethoxysilane, and oligomers thereof.

Also useful are organosilicon compounds containing in a molecule one or more groups selected from the class consisting of a vinyl group, an epoxy group, a silicon-bonded alkoxy group, and a silicon-bonded hydroxyl group. Suitable organosilicon compounds are shown below.

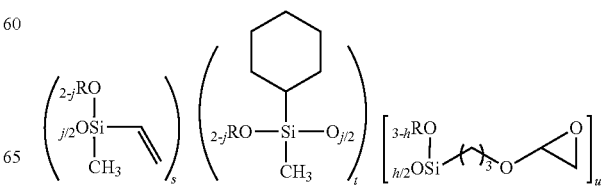

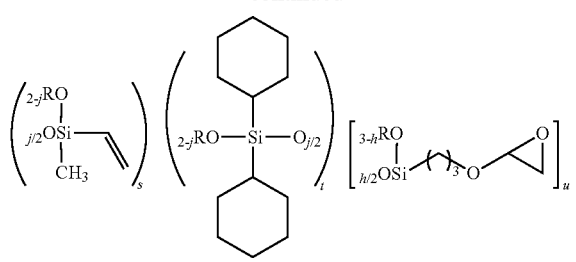
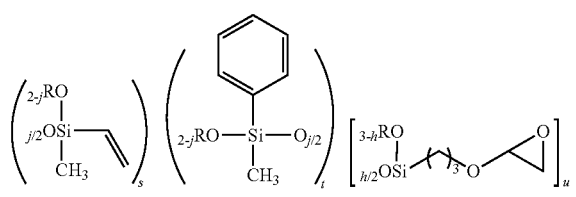
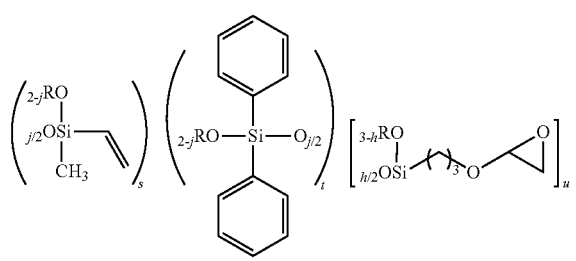
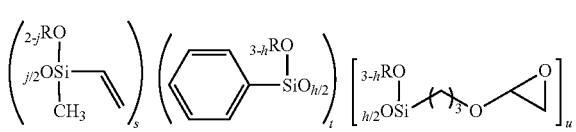
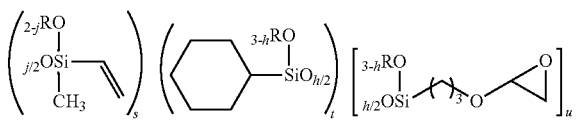
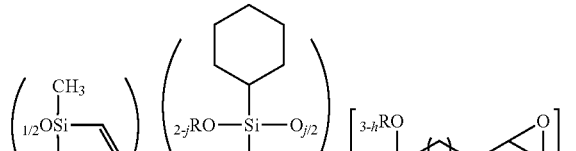
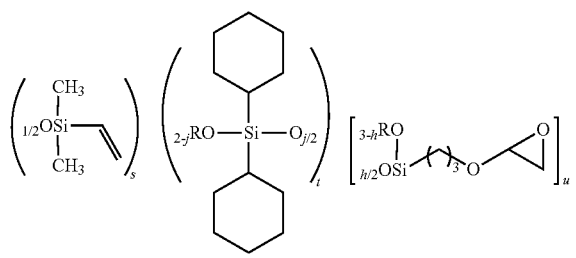
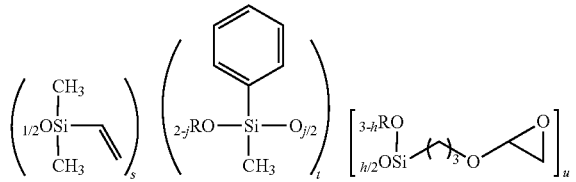
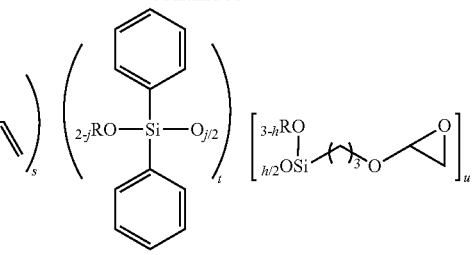
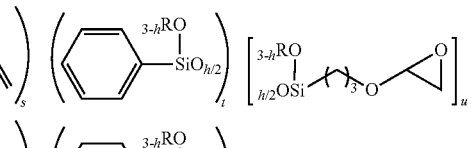
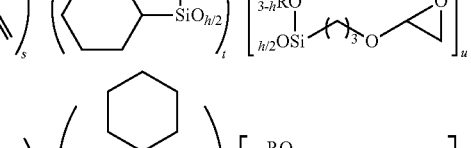
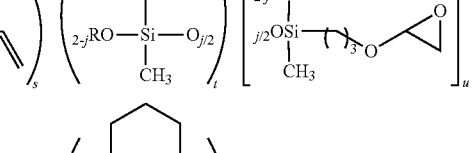
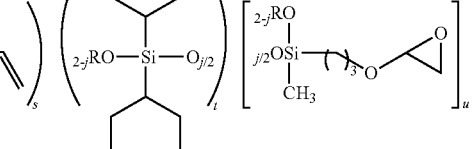
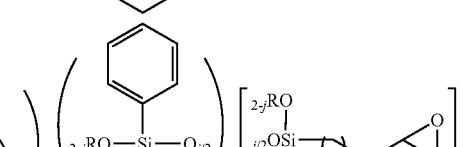
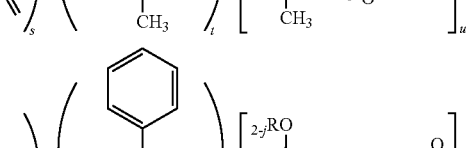
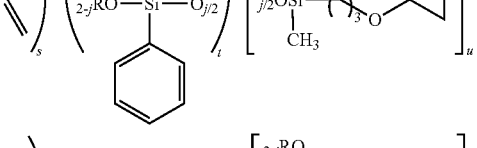
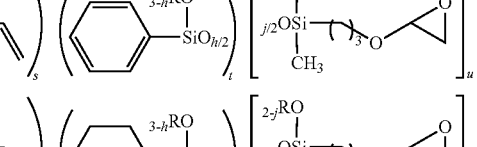
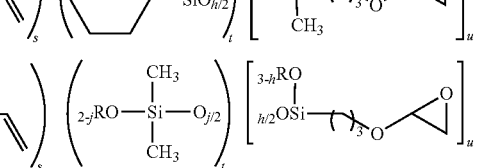

-continued

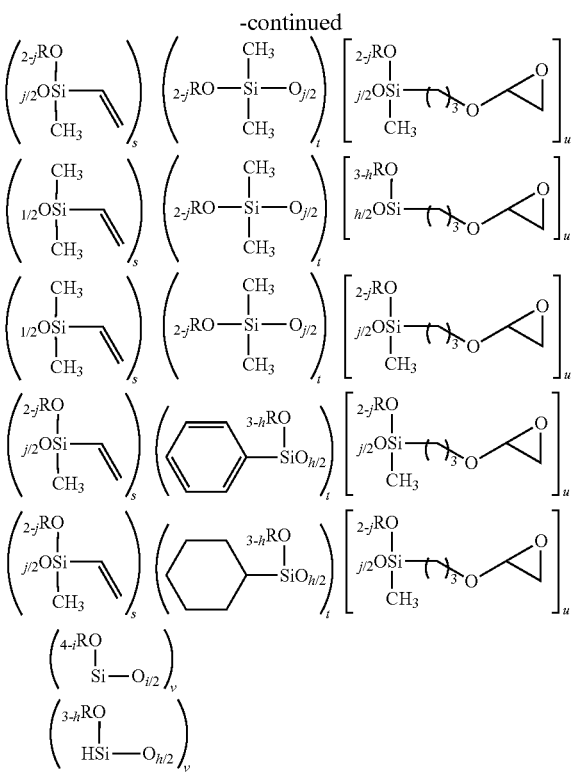

Herein R is a substituted or unsubstituted, monovalent hydrocarbon group, preferably of 1 to 6 carbon atoms. Typically R is an alkyl group such as methyl, ethyl, propyl, isopropyl, butyl, isobutyl, tert-butyl, pentyl, neopentyl, hexyl, octyl, nonyl or decyl. The subscripts i, j, and h are natural numbers, i is 1, 2, 3 or 4, h is 1, 2 or 3, and j is 1 or 2. The subscripts s, t and u are 0 or positive numbers, in the range: $0 \leq s \leq 1$, $0 \leq t \leq 1$, and $0 \leq u \leq 1$, satisfying $s+t+u=1$. The subscript v is a natural number in the range: $0 \leq v \leq 100$. These subscripts are such numbers that the organosilicon compound may have a Mw of 1,000 to 20,000, preferably 1,000 to 10,000, and more preferably 1,000 to 6,000 as measured by GPC versus polystyrene.

Most preferred among others is a tackifier having the following formula:

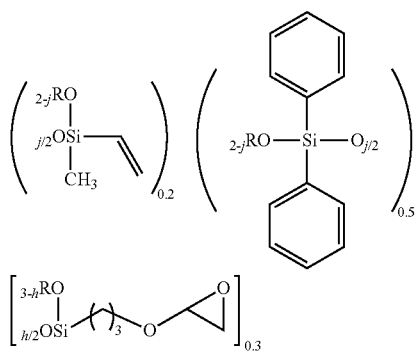

wherein R, j and h are as defined above.

The tackifiers may be used alone or in admixture.

Preferably the tackifier is added in an amount of 0 to 10% by weight, more preferably 0 to 5% by weight based on the total weight of components (A) to (C). When used, an amount of the tackifier is preferably at least 1% by weight. If the tackier is added in excess of the range, the composition may crack and lack reliability as encapsulant.

E) Condensation Catalyst

A condensation catalyst (E) may optionally be added to promote hydrolytic condensation reaction between molecules of component (B), and condensation reaction of component (B) with hydroxyl groups present on the substrate surface. Suitable condensation catalysts include tin(IV) and tin(IV) compounds such as tin dilaurate, di-n-butyltin dilaurate, tin dioctoate, tin bis(2-ethylhexanoate), tin bis(neodecanoate), di-n-butyldiacetoxytin, and tetrabutyltin; titanium compounds such as titanium tetraisopropoxide, titanium tetraoctoxide, titanium tetra-n-butoxide, titanium butoxide dimer, titanium tetra-2-ethylhexoxide, titanium diisopropoxide bis(acetylacetonate), titanium dioctyloxybis(octylene glycolate), and titanium diisopropoxide bis(ethyl acetoacetate); aluminum compounds such as aluminum trisacetylacetonate, aluminum trisacetoacetate, and tris(sec-butoxy)aluminum; nickel compounds such as nickel bisacetylacetonate; cobalt compounds such as cobalt trisacetylacetonate; zinc compounds such as zinc bisacetylacetonate; and zirconium compounds such as zirconium tetra-n-propoxide, zirconium tetra-n-butoxide, zirconium tetraacetylacetonate, zirconium tributoxymonoacetylacetonate, zirconium monobutoxyacetylacetonate, zirconium dibutoxybis(ethylacetoacetate), zirconium tetraacetylacetonate, and zirconium tributoxymonostearate. The condensation catalysts may be used alone or in admixture. Inter alia, zirconium base catalysts commercially available under the tradename of Orgatix ZA series from Matsumoto Trading Co., Ltd. are preferred since they have discoloration resistance and high catalysis.

When used, an amount of component (E) is 0.0001 to 1 part, more preferably 0.0001 to 0.1 part by weight per 100 parts by weight of components (A) and (B) combined. Outside the range, a larger amount of component (E) may cause discoloration to the cured composition whereas a less amount may be less effective for promoting adhesion.

In addition to the foregoing components (A) to (E), the silicone resin composition may further comprise any well-known additives, if necessary. Suitable additives include (F) inorganic fillers, for example, reinforcing inorganic fillers such as fumed silica and fumed titania, and non-reinforcing inorganic fillers such as calcium carbonate, calcium silicate, titanium dioxide, ferric oxide, carbon black, and zinc oxide; photostabilizers such as hindered amines; and reactive diluents such as vinyl ethers, vinyl amides, epoxy resins, oxetane derivatives, allyl phthalates, and vinyl adipate. These additives may be added in any desired amounts as long as the objects of the invention are not impaired.

Since phenyl-containing silicone is less heat resistant than dimethylsilicone, an antioxidant may be added if necessary. Suitable antioxidants include pentaerythritol tetrakis[3-(3,5-di-t-butyl-4-hydroxyphenyl)-propionate], N,N'-propane-1,3-diylbis[3-(3,5-di-tert-butyl-4-hydroxy-phenyl)propionamide], thiodiethylenebis[3-(3,5-di-tert-butyl-4-hydroxyphenyl)-propionate], octadecyl-3-(3,5-di-t-butyl-4-hydroxyphenyl)propionate, 6,6'-di-tert-butyl-2,2'-thiodi-p-cresol, N,N'-hexane-1,6-diylbis[3-(3,5-di-tert-butyl-4-hydroxy-phenylpropionamide)], benzenepropanoic acid, 3,5-bis(1,1-dimethylethyl)-4-hydroxy-pendant ($C_7$-$C_9$) alkyl ester, diethyl[[3,5-bis(1,1-dimethylethyl)-4-hydroxyphenyl]methyl]-phosphonate, 2,2'-ethylidenebis[4,6-di-tert-butylphenol], 3,3',3",5,5',5"-hexa-tert-butyl-a,a',a"-(mesitylene-2,4,6-triyl)tri-p-cresol, calcium diethylbis[[[3,5-bis(1,1-dimethylethyl)-4-hydroxy-phenyl]methyl]phosphonate], 4,6-bis(octylthiomethyl)-o-cresol, 4,6-bis(dodecylthiomethyl)-o-cresol, ethylene bis(oxyethylene)bis[3-(5-tert-butyl-4-hydroxy-m-tolyl)propionate], hexamethylenebis[3-(3,5-di-tert-butyl-4-hydroxylphenyl)-propionate, 1,3,5-tris(3,5-di-tert-butyl-4-hydroxybenzyl)-1,3,5-triazine-2,4,6-trione, 1,3,5-tris[(4-tert-butyl-3-hydroxy-2,6-xylyl)methyl]-1,3,5-triazine-2,4,6(1H,3H,5H)-trione, 6,6'-di-tert-butyl-4,4'-thiodi-m-cresol, diphenylamine, the reaction product of N-phenylbenzeneamine with 2,4,4-trimethylpentene, 2,6-di-tert-butyl-4-(4,6-bis(octylthio)-1,3,5-triazin-2-ylamino)phenol, 3,4-dihydro-2,5,7,8-tetramethyl-2-(4,8,12-trimethyl-tridecyl)-2H-1-benzopyran-6-ol, 2',3-bis[[3-[3,5-di-tert-butyl-4-hydroxyphenyl]propionyl]]-propionohydrazide, didodecyl 3,3'-thiodipropionate, and dioctadecyl 3,3'-thiodipropionate. Desirable antioxidants are commercially available under Irganox® 245, 259, 295, 565, 1010, 1035, 1076, 1098, 1135, 1130, 1425WL, 1520L, 1726, 3114, and 5057 from BASF. These antioxidants may be used alone or in admixture.

Preparation of Silicone Resin Composition

The silicone resin composition may be prepared by stirring, dissolving, mixing and dispersing the foregoing components simultaneously or sequentially while heating if necessary. Most often, the composition is formulated and stored in two parts, one part including components (A), (B) and (C) and the other part including components (B) and (D), so that no cure reaction may take place prior to use. On use, the two parts are mixed whereupon the composition cures. Specifically, it is recommended that components (C) and (D) be stored separately because of a potential dehydrogenation reaction during storage of components (C) and (D) in a common part. The composition may be formulated as one part if a minor amount of a cure retarder such as acetylene alcohol is added.

The apparatus used in stirring and mixing operations is not particularly limited although a mixer equipped with agitating and heating means such as an automated mortar, three-roll mill, ball mill, or planetary mixer may be used. A combination of such units may also be used. It is noted that the silicone resin composition thus obtained preferably has a viscosity of 100 to 10,000,000 mPa·s, more preferably 300 to 500,000 mPa·s at 25° C.

The silicone resin composition thus obtained may be quickly cured, upon heating if necessary, into a cured product which is highly transparent and tenaciously adherent to package materials such as liquid crystal polymers (LCP) or metal substrates, and thus effective as the encapsulant for optoelectronic members. Suitable optoelectronic members which can be encapsulated include LED, photodiodes, CCD, CMOS, and photocouplers. The silicone resin composition is best suited as the encapsulant for LED.

The method for encapsulating an optoelectronic member with the silicone resin composition in the cured state may be selected from well-known methods depending on a particular optoelectronic member. Typically the silicone resin composition is cured at a temperature of 40 to 250° C., preferably 60 to 200° C. for 5 minutes to 10 hours, preferably 30 minutes to 6 hours, although the curing conditions are not particularly limited.

When a silver-plated leadframe is encapsulated, preferably the leadframe is previously surface treated so that it may become more wettable with the silicone resin composition. For ease of operation and maintenance of apparatus, the previous surface treatment is preferably dry one such as UV treatment, ozone treatment, or plasma treatment, with the plasma treatment being most preferred.

The material of a premolded package is preferably one in which the content of silicone component is at least 15% by weight of all organic components in the premolded package, for the purpose of enhancing the compatibility of the premolded package with the silicone resin composition. As used herein, the term "silicone component" refers to a Si unit-containing compound and a polymer thereof. A material in which the content of silicone component is less than 15% by weight of all organic components is less compatible with the silicone resin composition, leaving a risk that when the premolded package is encapsulated with silicone resin composition, bubbles or voids are formed between the composition and the inner wall of the package. The resulting optoelectronic device tends to crack.

The silicone resin composition is preferably such that the cured composition of 1 mm thick may have a water vapor permeability of less than or equal to 15 g/m$^2$/day, more preferably 1 to 15 g/m$^2$/day, and even more preferably 5 to 15 g/m$^2$/day. In order that the silicone resin composition meet a water vapor permeability within the range, it is recommended to set the content of terminal arylvinyl-containing siloxane units in the vinyl resin (A) at or above 20 mol %. It is noted that the water vapor permeability is measured according to JIS K-7129 and by the Lyssy testing method (Lyssy tester L80-5000).

The cured product of the silicone resin composition has a low gas permeability and discoloration resistance when used for the encapsulation of optoelectronic members. The optoelectronic device encapsulated therewith is fully durable in reflection efficiency.

EXAMPLE

Examples of the invention are given below by way of illustration and not by way of limitation.

Synthesis Example 1

A flask was charged with 718 g of xylene and 2,571 g of water, to which a mixture of 1269.6 g (6.00 mol) of phenyltrichlorosilane, 621.08 g (2.00 mol) of bis(methylphenylvinylsiloxane) and 1,078 g of xylene was added dropwise. After the completion of dropwise addition, the solution was stirred for 3 hours, followed by waste acid separation, water washing, and azeotropic dewatering. 19.26 g (0.172 mol) of 50 wt % KOH aqueous solution was added to the residue, which was heated under reflux overnight at an internal temperature of 150° C. The solution was combined with 31.7 g (0.293 mol) of trimethylchlorosilane, neutralized with 28.7 g (0.293 mol) of potassium acetate and filtered, after which the solvent was distilled off in vacuum. The residue was washed with methanol, which was distilled off again, yielding a siloxane resin (Resin 1) having the average compositional formula shown below. The siloxane resin had a Mw of 1,400 as measured by GPC versus polystyrene and a vinyl equivalent of 0.233 mol/100 g.

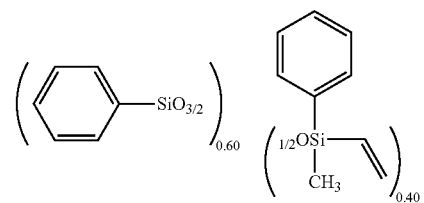

Synthesis Example 2

A flask was charged with 1,142 g of xylene and 4,629 g of water, to which a mixture of 2,285 g (10.8 mol) of phenyltrichlorosilane, 718.7 g (2.31 mol) of bis(methylphenylvinylsiloxane) and 1,712 g of xylene was added dropwise. After the completion of dropwise addition, the solution was stirred for 3 hours, followed by waste acid separation, water washing, and azeotropic dewatering. 20.64 g (0.184 mol) of 50 wt % KOH aqueous solution was added to the residue, which was heated under reflux overnight at an internal temperature of 150° C. The solution was combined with 34.0 g (0.313 mol) of trimethylchlorosilane, neutralized with 30.7 g (0.313 mol) of potassium acetate and filtered, after which the solvent was distilled off in vacuum. The residue was washed with methanol, which was distilled off again, yielding a siloxane resin (Resin 2) having the average compositional formula shown below. The siloxane resin had a Mw of 1,770 as measured by GPC versus polystyrene and a vinyl equivalent of 0.186 mol/100 g.

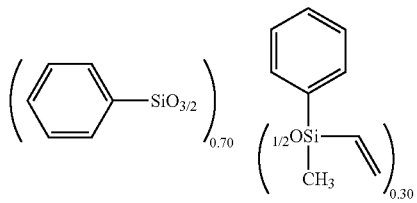

Synthesis Example 3

A flask was charged with 1,050 g of xylene and 5,096 g of water, to which a mixture of 2,285 g (10.8 mol) of phenyltrichlorosilane, 199 g (1.54 mol) of dimethyldichlorosilane, 479 g (1.54 mol) of bis(methylphenylvinylsiloxane) and 1,576 g of xylene was added dropwise. After the completion of dropwise addition, the solution was stirred for 3 hours, followed by waste acid separation, water washing, and azeotropic dewatering. 21.82 g (0.194 mol) of 50 wt % KOH aqueous solution was added to the residue, which was heated under reflux overnight at an internal temperature of 150° C. The solution was combined with 35.8 g (0.330 mol) of trimethylchlorosilane, neutralized with 32.4 g (0.330 mol) of potassium acetate and filtered, after which the solvent was distilled off in vacuum. There was synthesized a siloxane resin (Resin 3) having the average compositional formula shown below. The siloxane resin had a Mw of 1,850 as measured by GPC versus polystyrene and a vinyl equivalent of 0.161 mol/100 g.

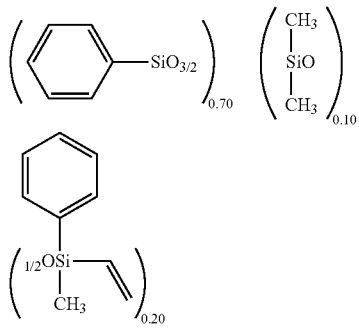

Synthesis Example 4

A flask was charged with 5,376 g (22.0 mol) of diphenyldimethoxysilane and 151.8 g of acetonitrile and cooled below 10° C. The following dropwise addition and reaction steps were carried out at an internal temperature below 10° C. First 303.69 g of conc. sulfuric acid was added dropwise, 940.36 g of water was added dropwise over 1 hour, and 2,216 g (16.5 mol) of $(HSiMe_2)_2O$ was added dropwise. After the completion of dropwise addition, the solution was stirred overnight, followed by waste acid separation, water washing, and vacuum distillation. There was synthesized an organohydrogenpolysiloxane 1 having the formula shown below, which had a hydrogen gas release of 90.32 ml/g (0.403 mol/100 g).

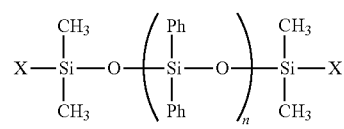

Herein n=2.0 (average), and X consists of 95.0 mol % of hydrogen and 5.0 mol % of alkoxy and hydroxyl groups in total.

Synthesis Example 5

A flask was charged with 1,000 g of xylene and 5,014 g of water, to which a mixture of 2,285 g (10.8 mol) of phenyltrichlorosilane, 326 g (2.70 mol) of vinyldimethylchlorosilane and 1,478 g of xylene was added dropwise. After the completion of dropwise addition, the solution was stirred for 3 hours, followed by waste acid separation, water washing, and azeotropic dewatering. 6 g (0.15 mol) of KOH was added to the residue, which was heated under reflux overnight at an internal temperature of 150° C. The solution was combined with 27 g (0.25 mol) of trimethylchlorosilane, neutralized with 24.5 g (0.25 mol) of potassium acetate and filtered, after which the solvent was distilled off in vacuum. There was synthesized a siloxane resin (Resin 4) having the average compositional formula shown below. The siloxane resin had a Mw of 1,820 as measured by GPC versus polystyrene and a vinyl equivalent of 0.131 mol/100 g.

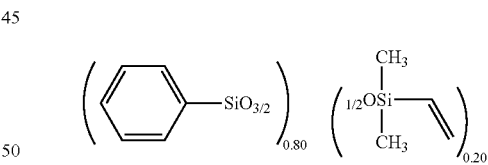

Synthesis Example 6

A flask was charged with 264.46 g (2.00 mol) of vinylmethyldimethoxysilane, 733.08 g (3.00 mol) of diphenyldimethoxysilane, 1,181.5 g (5.00 mol) of 3-glycidoxypropyltrimethoxysilane, and 2,700 ml of isopropyl alcohol, to which 82.00 g of 25 wt % tetramethylammonium hydroxide aqueous solution and 740 g of water were added and stirred for 3 hours. The reaction solution was combined with toluene, neutralized with a sodium dihydrogen phosphate aqueous solution, and washed with water. On vacuum distillation, a tackifier having the average compositional formula shown below was obtained.

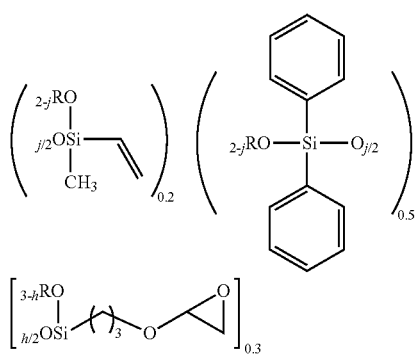

The product is a mixture of compounds wherein h=1, 2 or 3, j=1 or 2, and R is hydrogen, methyl or isopropyl.

Examples 1 to 5

Silicone resin compositions were prepared by mixing the components prepared in Synthesis Examples 1 to 4, and 6, and the following components in accordance with the formulation shown in Table 1.
(A') Vinyldimethylsiloxy-endcapped phenylmethylpolysiloxane having the following formula.
  phenyl content: 30 wt %
  vinyl equivalent: 0.0185 mol/100 g

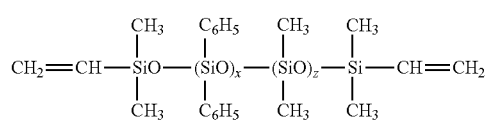

Herein x=30 and z=68.
(B) Phenyl-containing branched methylhydrogenpolysiloxane 2 having the following formula.
  hydrogen gas release: 170.24 ml/g (0.760 mol/100 g)

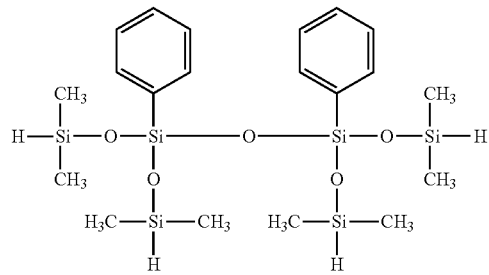 [SMILES: C[SiH](C)O[Si](O[SiH](C)C)(O[Si](O[SiH](C)C)(O[SiH](C)C)c1ccccc1)c1ccccc1]

(C) Platinum catalyst: octyl alcohol-modified solution of chloroplatinic acid (Pt concentration 2 wt %)

Comparative Examples 1 and 2

Silicone resin compositions were prepared by mixing the component prepared in Synthesis Example 5 and the foregoing components in accordance with the formulation shown in Table 1.

Each of the silicone resin compositions of Examples 1 to 5 and Comparative Examples 1 and 2 was heat molded at 150° C. for 4 hours into a cured sample of 110 mm long by 120 mm wide by 2 mm thick. The appearance of the sample was visually observed. The sample was measured for tensile strength, hardness (using A and D type spring testers) and elongation according to JIS K-6301. The sample was also measured for moisture permeability by the Lyssy testing method (Lyssy tester L80-5000) and according to JIS K-7129.

Also optoelectronic devices encapsulated with the silicone resin compositions of Examples 1 to 5 and Comparative Examples 1 and 2 were fabricated as follows.

A copper leadframe with a silver plating of 2 μm thick was mounted on the bottom of a cup-shaped premolded plastic LED package (3 mm×3 mm×1 mm, opening diameter 2.6 mm). The premolded package was treated in vacuum with an Ar plasma (power 100 W, irradiation time 10 seconds). An electrode of an InGaN blue light-emitting diode was connected to the leadframe on the bottom using silver paste (conductive adhesive). The counter electrode of the LED was connected to a counter leadframe using a gold wire. The opening of the package was filled with the addition cure silicone resin composition, which was cured by heating at 60° C. for 1 hour and at 150° C. for 4 hours, completing encapsulation.

The LED package thus fabricated was operated with a current flow of 25 mA in an atmosphere where hydrogen sulfide was generated in a concentration of 10 ppm. The LED package was held in the hydrogen sulfide atmosphere at 100° C. for 100 hours. Thereafter, a degree of discoloration near the silver plating surface within the package was visually examined.

Five LED packages similarly fabricated were subjected to a thermal cycling test (200 cycles of −40° C.×10 min. and 100° C.×10 min.) and a 500-hour LED operation test under 60° C./90% RH. After the test, the packages were visually observed for adhesion failure at the package interface, cracking, and discoloration.

The results are shown in Table 1. The abbreviation "pbw" is parts by weight.

TABLE 1

| | | Example | | | | | Comparative Example | |
|---|---|---|---|---|---|---|---|---|
| Formulation | | 1 | 2 | 3 | 4 | 5 | 1 | 2 |
| Si—H/Si-Vi | Molar ratio | 1.10 | 1.10 | 1.10 | 1.10 | 1.10 | 1.10 | 1.10 |
| Resin 1 | pbw | 61.2 | | | | | | |
| Resin 2 | pbw | | 66.4 | | | 59.3 | | |
| Resin 3 | pbw | | | 69.5 | 64.0 | | | |
| Resin 4 | pbw | | | | | | 69.4 | 77 |

TABLE 1-continued

|  | Formulation | Example 1 | Example 2 | Example 3 | Example 4 | Example 5 | Comparative Example 1 | Comparative Example 2 |
|---|---|---|---|---|---|---|---|---|
| Vinyldimethylsiloxy-end-capped phenylmethylpolysiloxane | pbw |  |  |  | 10.0 | 10.0 | 10 |  |
| Hydrogen-polysiloxane 1 | pbw | 38.8 | 33.6 | 30.5 | 23.0 | 30.7 | 15.4 | 18 |
| Hydrogen-polysiloxane 2 | pbw |  |  |  | 3 |  | 5.2 | 5 |
| Platinum catalyst | pbw | 0.02 | 0.02 | 0.02 | 0.02 | 0.02 | 0.02 | 0.02 |
| Tackifier | pbw | 4 | 4 | 4 | 4 | 4 | 4 | 4 |
| Evaluation results | | | | | | | | |
| Appearance as cured |  | colorless, transparent | colorless, transparent | colorless, transparent | colorless, transparent | colorless, transparent | colorless, transparent | colorless, transparent |
| Hardness | Type A | — | — | 88 | 92 | 89 | 87 | — |
|  | Type D | 48 | 56 | 22 | 43 | 22 | 22 | 47 |
| Tensile strength | MPa | 3.6 | 3.1 | 3.5 | 1.7 | 2.6 | 1.9 | 0.9 |
| Elongation | % | 115 | 80 | 100 | 120 | 185 | 65 | 15 |
| Moisture permeability | g/m²/day | 9 | 9 | 10 | 12 | 12 | 19 | 17 |
| Sulfide test | discoloration | colorless, transparent | colorless, transparent | colorless, transparent | colorless, transparent | colorless, transparent | brown | somewhat brown |
| Thermal cycling test | failed samples/5 discoloration | 0/5 colorless, transparent | 0/5 colorless, transparent | 0/5 colorless, transparent | 0/5 colorless, transparent | 0/5 colorless, transparent | 1/5 (cracked) colorless, transparent | 5/5 (cracked) colorless, transparent |
| Hot/humid operation test | failed samples/5 discoloration | 0/5 colorless, transparent | 0/5 colorless, transparent | 0/5 colorless, transparent | 0/5 colorless, transparent | 0/5 colorless, transparent | 1/5 (cracked) colorless, transparent | 3/5 (cracked) colorless, transparent |

Note:
Si-Vi is a total of components (A), (A') and tackifier

As seen from Table 1, the cured products of the silicone resin compositions within the scope of the invention are low moisture permeable and do not discolor in the sulfide test. In the reliability tests, neither cracking nor delamination occurs.

The silicone resin compositions of the invention give cured products having low gas permeability as compared with conventional phenyl base silicone resin compositions and are suitable for the encapsulation of optoelectronic members. The resultant optoelectronic devices are fully resistant to gas transmission.

Japanese Patent Application No. 2010-196667 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A low gas permeable silicone resin composition comprising
    (A) 20 to 95 parts by weight of an organopolysiloxane containing at least two alkenyl groups in a molecule, having the average compositional formula (1):

$$(R^1SiO_{3/2})_a(R^2{}_2SiO)_b(R^1R^2R^3SiO_{1/2})_c \quad (1)$$

wherein
    $R^1$ is each independently $C_6$-$C_{14}$ aryl,
    $R^2$ which may be the same as or different from $R^1$ is each independently a substituted or unsubstituted, monovalent hydrocarbon group,
    $R^3$ is $C_2$-$C_8$ alkenyl,
    a is a positive number of 0.3 to 0.9,
    b is a positive number of 0 to 0.5,
    c is a positive number of 0.05 to 0.7, and
    a+b+c=1.0,
    (B) 0.01 to 40 parts by weight of an organohydrogenpolysiloxane containing at least two silicon-bonded hydrogen atoms in a molecule, having the average compositional formula (2):

$$R^1{}_dR^2{}_eH_fSiO_{(4-d-e-f)/2} \quad (2)$$

wherein $R^1$ and $R^2$ are as defined above, d is a positive number of 0.6 to 1.5, e is a positive number of 0 to 0.5, f is a positive number of 0.4 to 1.0, and d+e+f=1.0 to 2.5, and
    (C) a catalytic amount of an addition reaction catalyst.

2. The silicone resin composition of claim 1 wherein component (B) is present in such an amount as to provide 0.4 to 4.0 moles of SiH groups per mole of alkenyl groups in component (A).

3. The silicone resin composition of claim 1 wherein component (B) comprises 50 to 100% by weight of an organohydrogenpolysiloxane having the general formula (3):

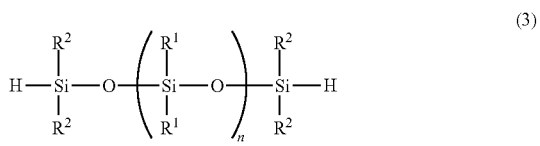

wherein $R^1$ is each independently $C_6$-$C_{14}$ aryl, $R^2$ which may be the same as or different from $R^1$ is each independently a substituted or unsubstituted, monovalent hydrocarbon group, and n is an integer of at least 1.

4. The silicone resin composition of claim 1, further comprising (A') an organopolysiloxane having the general formula (4):

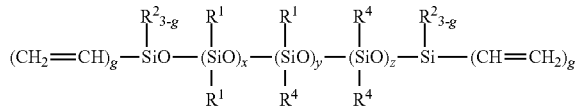

(4)

wherein $R^1$ is each independently $C_6$-$C_{14}$ aryl, $R^2$ which may be the same as or different from $R^1$ is each independently a substituted or unsubstituted, monovalent hydrocarbon group, $R^4$ which may be the same as or different from $R^1$ is each independently a substituted or unsubstituted, monovalent hydrocarbon group, g is an integer of 1, 2 or 3, x, y and z each are 0 or a positive integer, satisfying $1 \leq x+y+z \leq 1,000$, and at least one of x and y is at least 1, component (A') being present in an amount of 0.01 to 50 parts by weight per 100 parts by weight of components (A) and (B) combined.

5. The silicone resin composition of claim 1, further comprising (D) a tackifier.

6. The silicone resin composition of claim 1, further comprising (E) a condensation catalyst.

7. The silicone resin composition of claim 1, further comprising (F) an inorganic filler.

8. A cured composition formed by curing a silicone resin composition comprising (A) 20 to 95 parts by weight of an organopolysiloxane containing at least two alkenyl groups in a molecule, having the average compositional formula (1):

$$(R^1SiO_{3/2})_a(R^2{}_2SiO)_b(R^1R^2R^3SiO_{1/2})_c \quad (1)$$

wherein $R^1$ is each independently $C_6$-$C_{14}$ aryl, $R^2$ which may be the same as or different from $R^1$ is each independently a substituted or unsubstituted, monovalent hydrocarbon group, $R^3$ is $C_2$-$C_8$ alkenyl, a is a positive number of 0.3 to 0.9, b is a positive number of 0 to 0.5, c is a positive number of 0.05 to 0.7, and a+b+c=1.0, (B) 0.01 to 40 parts by weight of an organohydrogenpolysiloxane containing at least two silicon-bonded hydrogen atoms in a molecule, having the average compositional formula (2):

$$R^1{}_dR^2{}_eH_fSiO_{(4-d-e-f)/2} \quad (2)$$

wherein $R^1$ and $R^2$ are as defined above, d is a positive number of 0.6 to 1.5, e is a positive number of 0 to 0.5, f is a positive number of 0.4 to 1.0, and d+e+f=1.0 to 2.5, and (C) a catalytic amount of an addition reaction catalyst, wherein a layer of said cured composition of 1 millimeter in thickness has a water vapor permeability of less than or equal to 15 g/m²/day.

9. The silicone resin composition of claim 1, for use in encapsulating optoelectronic members.

10. An optoelectronic device comprising an optoelectronic member encapsulated with a composition formed by curing a silicone resin composition comprising (A) 20 to 95 parts by weight of an organopolysiloxane containing at least two alkenyl groups in a molecule, having the average compositional formula (1):

$$(R^1SiO_{3/2})_a(R^2{}_2SiO)_b(R^1R^2R^3SiO_{1/2})_c \quad (1)$$

wherein $R^1$ is each independently $C_6$-$C_{14}$ aryl, $R^2$ which may be the same as or different from $R^1$ is each independently a substituted or unsubstituted, monovalent hydrocarbon group, $R^3$ is $C_2$-$C_8$ alkenyl, a is a positive number of 0.3 to 0.9, b is a positive number of 0 to 0.5, c is a positive number of 0.05 to 0.7, and a+b+c=1.0, (B) 0.01 to 40 parts by weight of an organohydrogenpolysiloxane containing at least two silicon-bonded hydrogen atoms in a molecule, having the average compositional formula (2):

$$R^1{}_dR^2{}_eH_fSiO_{(4-d-e-f)/2} \quad (2)$$

wherein $R^1$ and $R^2$ are as defined above, d is a positive number of 0.6 to 1.5, e is a positive number of 0 to 0.5, f is a positive number of 0.4 to 1.0, and d+e+f=1.0 to 2.5, and (C) a catalytic amount of an addition reaction catalyst.

11. The silicone resin composition of claim 5, wherein component (A) is

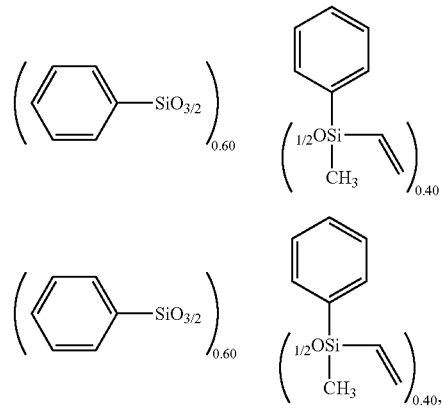

component (B) is

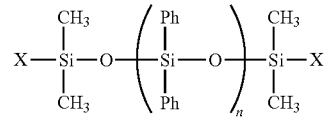

wherein n is an average value of 2.0 and X consists of 95.0 mol % of hydrogen and 5.0 mol % of alkoxy and hydroxyl groups in total, component (C) is an octyl alcohol-modified solution of chloroplatinic acid (Pt concentration 2 weight-%), and component (D) is

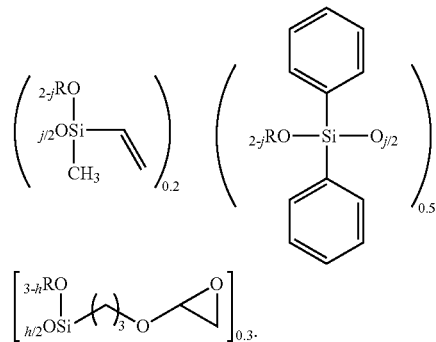

12. The silicone resin composition of claim 5, wherein component (A) is

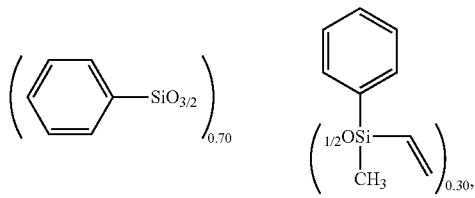

component (B) is

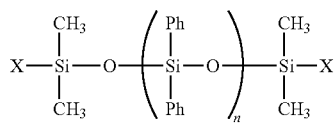

wherein n is an average value of 2.0 and X consists of 95.0 mol % of hydrogen and 5.0 mol % of alkoxy and hydroxyl groups in total,
component (C) is an octyl alcohol-modified solution of chloroplatinic acid (Pt concentration 2 weight-%), and component (D) is

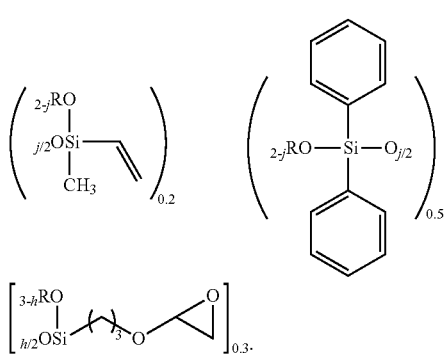

13. The silicone resin composition of claim 5, wherein component (A) is

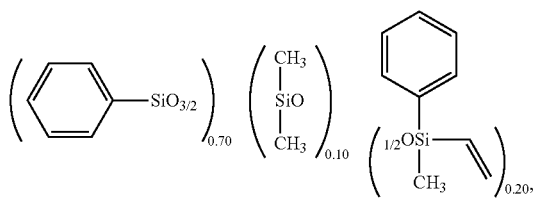

component (B) is

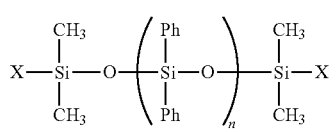

wherein n is an average value of 2.0 and X consists of 95.0 mol % of hydrogen and 5.0 mol % of alkoxy and hydroxyl groups in total, and
component (C) is an octyl alcohol-modified solution of chloroplatinic acid (Pt concentration 2 weight-%), and component (D) is

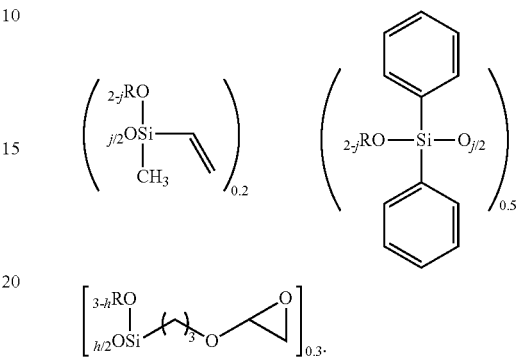

14. The silicone resin composition of claim 5, wherein component (A) is

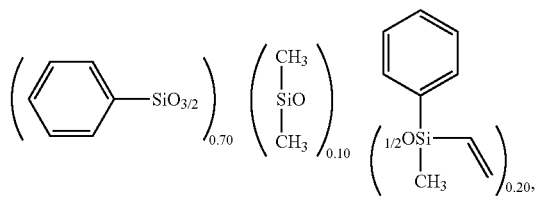

component (B) is

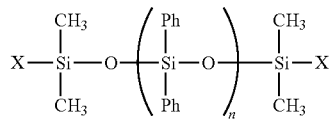

wherein n is an average value of 2.0 and X consists of 95.0 mol % of hydrogen and 5.0 mol % of alkoxy and hydroxyl groups in total, and

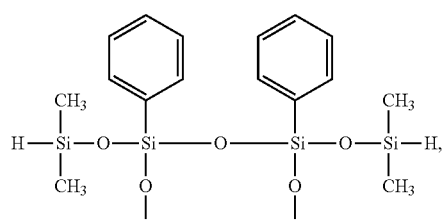

component (C) is an octyl alcohol-modified solution of chloroplatinic acid (Pt concentration 2 weight-%), and component (D) is

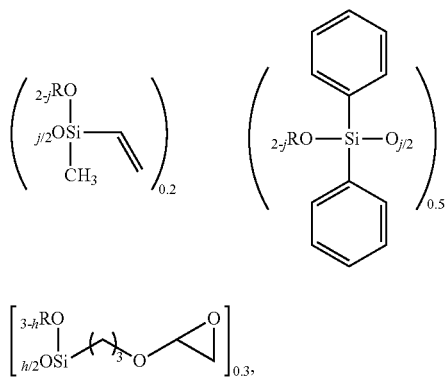

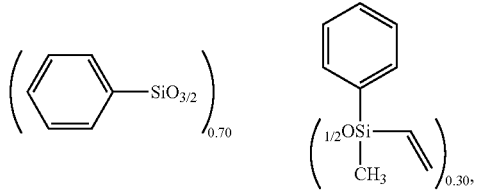

said silicone resin composition further comprising a component (A') having the formula

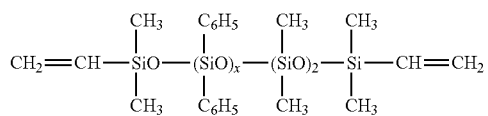

wherein x=30 and z=68.

15. The silicone resin composition of claim 5, wherein component (A) is $$\left( \bigcirc\!\!-\!\!SiO_{3/2} \right)_{0.70} \left( \begin{array}{c} Ph \\ | \\ _{1/2}OSi\!-\!CH\!=\!CH_2 \\ | \\ CH_3 \end{array} \right)_{0.30},$$

component (B) is

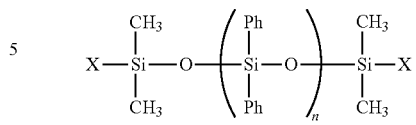

wherein n is an average value of 2.0 and X consists of 95.0 mol % of hydrogen and 5.0 mol % of alkoxy and hydroxyl groups in total, component (C) is an octyl alcohol-modified solution of chloroplatinic acid (Pt concentration 2 weight-%), and component (D) is

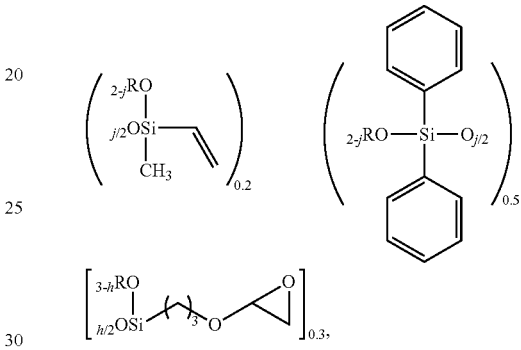

said silicone resin composition further comprising a component (A') having the formula

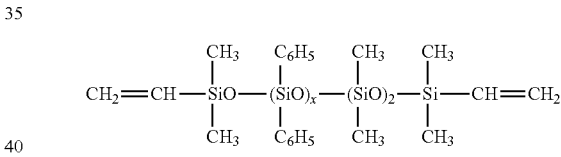

wherein x=30 and z=68.

* * * * *